(12) United States Patent
Yabuki

(10) Patent No.: US 10,733,331 B2
(45) Date of Patent: Aug. 4, 2020

(54) INFORMATION PROCESSING APPARATUS, INFORMATION PROCESSING METHOD, AND RECORDING MEDIUM

(71) Applicant: NEC CORPORATION, Tokyo (JP)

(72) Inventor: Kentarou Yabuki, Tokyo (JP)

(73) Assignee: NEC CORPORATION, Minato-ku, Tokyo (JP)

( * ) Notice: Subject to any disclaimer, the term of this patent is extended or adjusted under 35 U.S.C. 154(b) by 388 days.

(21) Appl. No.: 15/556,939

(22) PCT Filed: Mar. 9, 2016

(86) PCT No.: PCT/JP2016/001283
§ 371 (c)(1),
(2) Date: Sep. 8, 2017

(87) PCT Pub. No.: WO2016/143337
PCT Pub. Date: Sep. 15, 2016

(65) Prior Publication Data
US 2018/0032640 A1 Feb. 1, 2018

(30) Foreign Application Priority Data
Mar. 11, 2015 (JP) .................................. 2015-048474

(51) Int. Cl.
*G06F 30/00* (2020.01)
*G06F 11/34* (2006.01)
(Continued)

(52) U.S. Cl.
CPC ......... *G06F 30/00* (2020.01); *G05B 23/0243* (2013.01); *G06F 11/34* (2013.01); *G06F 11/3013* (2013.01); *G06F 11/3452* (2013.01)

(58) Field of Classification Search
CPC .. G06F 11/3013; G06F 11/34; G06F 11/3452; G06F 17/50; G05B 23/0243
See application file for complete search history.

(56) References Cited

U.S. PATENT DOCUMENTS

2007/0150209 A1* 6/2007 McPherson ............ G16H 10/40
702/32
2009/0217099 A1 8/2009 Kato
(Continued)

FOREIGN PATENT DOCUMENTS

JP  2001-184121 A  7/2001
JP  2005-149137 A  6/2005
(Continued)

OTHER PUBLICATIONS

International Seach Report for PCT/JP2016/001283, dated Apr. 12, 2016 (PCT/ISA/210) English translation.
(Continued)

*Primary Examiner* — Kyle R Quigley
(74) *Attorney, Agent, or Firm* — Sughrue Mion, PLLC

(57) ABSTRACT

Monitoring of a state of a system can be accurately performed even when a timing at which a relation changes is different for each set of the metrics. A monitoring apparatus 100 includes a model storage unit 122 and a determination unit 115. The model storage unit 122 stores, for each of a plurality of metric sets in a system, a model representing a relation among metrics included in the corresponding metric set. The determination unit 115 determines and outputs whether the system is in one state, by comparing a combination of models to which the plurality of metric sets conform respectively when the system is in the one state and a combination of models to which the plurality of metric sets conform respectively when the system is in a state to be determined.

6 Claims, 20 Drawing Sheets

(51) Int. Cl.
*G05B 23/02* (2006.01)
*G06F 11/30* (2006.01)

(56) References Cited

U.S. PATENT DOCUMENTS

2010/0205483 A1   8/2010  Ishiou
2011/0246837 A1  10/2011  Kato
2012/0191442 A1   7/2012  Hasegawa

FOREIGN PATENT DOCUMENTS

| JP | 2009521437 A | 6/2009 |
| JP | 2010-186310 A | 8/2010 |
| JP | 4872944 B2 | 2/2012 |
| JP | 2013-229064 A | 11/2013 |
| JP | 5387779 B2 | 1/2014 |
| JP | 5605476 B2 | 10/2014 |

OTHER PUBLICATIONS

Written Opinion of the International Searching Authority for PCT/JP2016/001283, dated Apr. 12, 2016 (PCT/ISA/237) English translation.
Communication dated Mar. 24, 2020, from the Japanese Patent Office in application No. 2017-504869.

* cited by examiner

Fig. 7

133 STATE INFORMATION

| STATE | PERIOD | COMMENT |
|---|---|---|
| P1 | 2015/01/01 00:00-04:00 | PROGRESS FROM START BY 10% |
| P2 | 2015/01/01 04:00-07:00 | PROGRESS FROM START BY 20% |
| P3 | 2015/01/01 07:00-10:00 | PROGRESS FROM START BY 30% |
| P4 | 2015/01/01 10:00-14:00 | PROGRESS FROM START BY 40% |
| P5 | 2015/01/01 14:00-17:00 | PROGRESS FROM START BY 50% |
| P6 | 2015/01/01 17:00-20:00 | PROGRESS FROM START BY 60% |

Fig. 8

| METRIC (INPUT, OUTPUT) | CORRELATION MODEL | CORRELATION FUNCTION |
|---|---|---|
| A, B | Mab(1) | Fab(1) |
| | Mab(2) | Fab(2) |
| A, C | Mac(1) | Fac(1) |
| | Mac(2) | Fac(2) |
| | Mac(3) | Fac(3) |
| B, C | Mbc(1) | Fbc(1) |
| | Mbc(2) | Fbc(2) |
| D, E | Mde(1) | Fde(1) |
| | Mde(2) | Fde(2) |
| D, F | Mdf(1) | Fdf(1) |
| | Mdf(2) | Fdf(2) |
| | Mdf(3) | Fdf(3) |

Fig. 10

134 MODEL COMBINATION INFORMATION

| STATE | METRIC (INPUT, OUTPUT) | CORRELATION MODEL | | | | | |
|---|---|---|---|---|---|---|---|
| | | P1 | P2 | P3 | P4 | P5 | P6 |
| A, B | | Mab(1) | Mab(1) | Mab(1) | Mab(1) | Mab(1) | Mab(1) |
| A, C | | Mac(1) | Mac(2) | Mac(2) | Mac(3) | Mac(3) | Mac(1) |
| B, C | | Mbc(1) | Mbc(1) | Mbc(1) | Mbc(1) | Mbc(1) | Mbc(2) |
| D, E | | Mde(1) | Mde(1) | Mde(1) | Mde(1) | Mde(2) | Mde(2) |
| D, F | | Mdf(1) | Mdf(2) | Mdf(3) | Mdf(2) | Mdf(3) | Mdf(3) |

Fig. 11

COMBINATION OF CORRELATION MODELS FOR
DETERMINATION TARGET PERIOD (DETERMINATION TARGET PERIOD: 2015/02/01 10:00-11:00)

|  | | CORRELATION MODEL |
|---|---|---|
| METRIC (INPUT, OUTPUT) | A, B | Mab(1) |
| | A, C | Mac(1) |
| | B, C | Mbc(2) |
| | D, E | Mde(1) |
| | D, F | Mdf(1) |

Fig. 13

SYSTEM STATE DETERMINATION RESULT (DETERMINATION TARGET PERIOD: 2015/02/01 10:00-11:00)

| STATE | SIMILARITY | PERIOD | COMMENT |
|---|---|---|---|
| P1 | 80% | 2015/01/01 00:00-04:00 | PROGRESS FROM START BY 10% |
| P2 | 60% | 2015/01/01 04:00-07:00 | PROGRESS FROM START BY 20% |
| P6 | 60% | 2015/01/01 17:00-20:00 | PROGRESS FROM START BY 60% |

Fig. 17

134 MODEL COMBINATION INFORMATION

| STATE | METRIC (INPUT, OUTPUT) | CORRELATION MODEL AND OCCUPATION RATE ||||||
|---|---|---|---|---|---|---|---|
| | | P1 | P2 | P3 | P4 | P5 | P6 |
| A, B | | Mab(1):1.0 | Mab(1):1.0 | Mab(1):1.0 | Mab(1):1.0 | Mab(1):1.0 | Mab(1):1.0 |
| A, C | | Mac(1):0.75 Mac(2):0.25 | Mac(2):1.0 | Mac(2):1.0 | Mac(3):1.0 | Mac(3):1.0 | Mac(1):1.0 |
| B, C | | Mbc(1):1.0 | Mbc(1):1.0 | Mbc(1):1.0 | Mbc(1):1.0 | Mbc(1):0.7 Mbc(2):0.3 | Mbc(2):1.0 |
| D, E | | Mde(1):1.0 | Mde(1):1.0 | Mde(1):1.0 | Mde(1):1.0 | Mde(1):0.3 Mde(2):0.7 | Mde(2):1.0 |
| D, F | | Mdf(1):0.7 Mdf(2):0.3 | Mdf(2):1.0 | Mdf(3):1.0 | Mdf(2):0.75 Mdf(3):0.25 | Mdf(3):1.0 | Mdf(3):1.0 |

Fig. 18

COMBINATION OF CORRELATION MODELS FOR
DETERMINATION TARGET PERIOD
(DETERMINATION TARGET PERIOD: 2015/02/01 10:00-11:00)

| | | CORRELATION MODEL AND OCCUPATION RATE |
|---|---|---|
| METRIC (INPUT, OUTPUT) | A, B | Mab(1):1.0 |
| | A, C | Mac(1):1.0 |
| | B, C | Mbc(1):0.3<br>Mbc(2):0.7 |
| | D, E | Mde(1):1.0 |
| | D, F | Mdf(1):0.7<br>Mdf(2):0.3 |

INFORMATION PROCESSING APPARATUS, INFORMATION PROCESSING METHOD, AND RECORDING MEDIUM

CROSS REFERENCE TO RELATED APPLICATIONS

This application is a National Stage of International Application No. PCT/JP2016/001283 filed Mar. 9, 2016 claiming priority based on Japanese Patent Application No. 2015-048474, filed Mar. 11, 2015, the contents of all of which are incorporated herein by reference in their entirety.

TECHNICAL FIELD

The present invention relates to an information processing apparatus, an information processing method, and a recording medium.

BACKGROUND ART

In a plant system, such as a chemical plant, a petroleum refining plant, or an iron-making plant, it is required to monitor whether transition among various processing states (steps) is performed as planned.

As a technique for monitoring a state of a system, for example, an invariant relation analysis described in PTL 1 is known. In the invariant relation analysis described in PTL 1, a set of correlation functions representing a statistical relation of each of a plurality of pairs of metrics (performance indexes) of the system is set as a correlation model for each period, such as a day of the week or a period of time, during which the system has a specific state. Then, an abnormality of the system is detected by determining whether a newly-acquired metric value conforms to the correlation model associated with a period during which the value is acquired.

FIG. 20 is a diagram illustrating an example of a statistical relation among metrics for each state of a system. In the example of FIG. 20, a relation (Rxy) of each pair of the metrics ("A, C", "B, C", "D, E", "D, F") changes for each period (T1, T2, . . . ) associated with each state of the system (P1, P2, . . . ). A correlation function (Fxy) is detected for each pair of the metrics, for each period, and a set of correlation functions is set in a correlation model (M1, M2, . . . ).

It is to be noted that, as related arts, PTL 2 discloses a technique in which a correlation model is generated for each of a plurality of pairs of metrics of a system, and an abnormality of the system is detected, in the invariant relation analysis. In addition, PTL 3 discloses a technique in which a larger period to which a correlation model generated for each period can be applied is extracted and is associated with an attribute on a calendar, so that an application schedule of the correlation model is decided, in the invariant relation analysis.

CITATION LIST

Patent Literature

[PTL 1] Japanese Patent No. 5387779
[PTL 2] Japanese Patent No. 4872944
[PTL 3] Japanese Patent No. 5605476

SUMMARY OF INVENTION

Technical Problem

However, in the above-described plant system, a timing at which a relation changes is different for each pair of metrics (or a set of metrics), and furthermore, the relation may change within the same state (step) depending on a pair (set).

FIG. 21 is a diagram illustrating another example of a relation among metrics for each state of a system. In the example of FIG. 21, a relation of each pair of the metrics changes at a timing independent from a period (T1, T2, . . . ) associated with a state (P1, P2, . . . ), and also changes within each period.

In this case, even if a correlation function is detected and a correlation model is generated for each period (T1, T2, . . . ) associated with a state of the system (P1, P2, . . . ) as in FIG. 20, an error of the correlation model becomes large. Thus, the correlation model generated for each state of the system cannot properly perform detection of an abnormality of the system.

An object of the present invention is to provide an information processing apparatus, an information processing method, and a recording medium which can solve the above-described problem, and can accurately perform monitoring of a state of a system even when a timing at which a relation changes is different for each set of metrics.

Solution to Problem

An information processing apparatus according to an exemplary aspect of the present invention includes: a model storage means for storing, for each of a plurality of metric sets in a system, a model representing a relation among metrics included in the corresponding metric set; and a determination means for determining and outputting whether the system is in one state, by comparing a combination of models to which the plurality of metric sets conform respectively when the system is in the one state and a combination of models to which the plurality of metric sets conform respectively when the system is in a state to be determined.

An information processing method according to an exemplary aspect of the present invention includes: storing, for each of a plurality of metric sets in a system, a model representing a relation among metrics included in the corresponding metric set; and determining and outputting whether the system is in one state, by comparing a combination of models to which the plurality of metric sets conform respectively when the system is in the one state and a combination of models to which the plurality of metric sets conform respectively when the system is in a state to be determined.

A computer readable storage medium according to an exemplary aspect of the present invention records thereon a program causing a computer to perform a method including: storing, for each of a plurality of metric sets in a system, a model representing a relation among metrics included in the corresponding metric set; and determining and outputting whether the system is in one state, by comparing a combination of models to which the plurality of metric sets conform respectively when the system is in the one state and a combination of models to which the plurality of metric sets conform respectively when the system is in a state to be determined.

Advantageous Effects of Invention

An advantageous effect of the present invention is to accurately perform monitoring of a state of a system, even when a timing at which a relation changes is different for each set of metrics.

BRIEF DESCRIPTION OF DRAWINGS

FIG. 7 is a diagram illustrating state information 133 in the example embodiment of the present invention.

FIG. 8 is a diagram illustrating an example of correlation models 132 in the example embodiment of the present invention.

FIG. 10 is a diagram illustrating an example of model combination information 134 in the example embodiment of the present invention.

FIG. 11 is a diagram illustrating an example of a combination of correlation models 132 extracted for a determination target period in the example embodiment of the present invention.

FIG. 13 is a diagram illustrating an example of a determination result screen 136 in the example embodiment of the present invention.

FIG. 17 is a diagram illustrating another example of model combination information 134 in the example embodiment of the present invention.

FIG. 18 is a diagram illustrating another example of a combination of correlation models 132 extracted during the determination target period in the example embodiment of the present invention.

DESCRIPTION OF EMBODIMENTS

An example embodiment of the present invention will be described.

Figure 2:
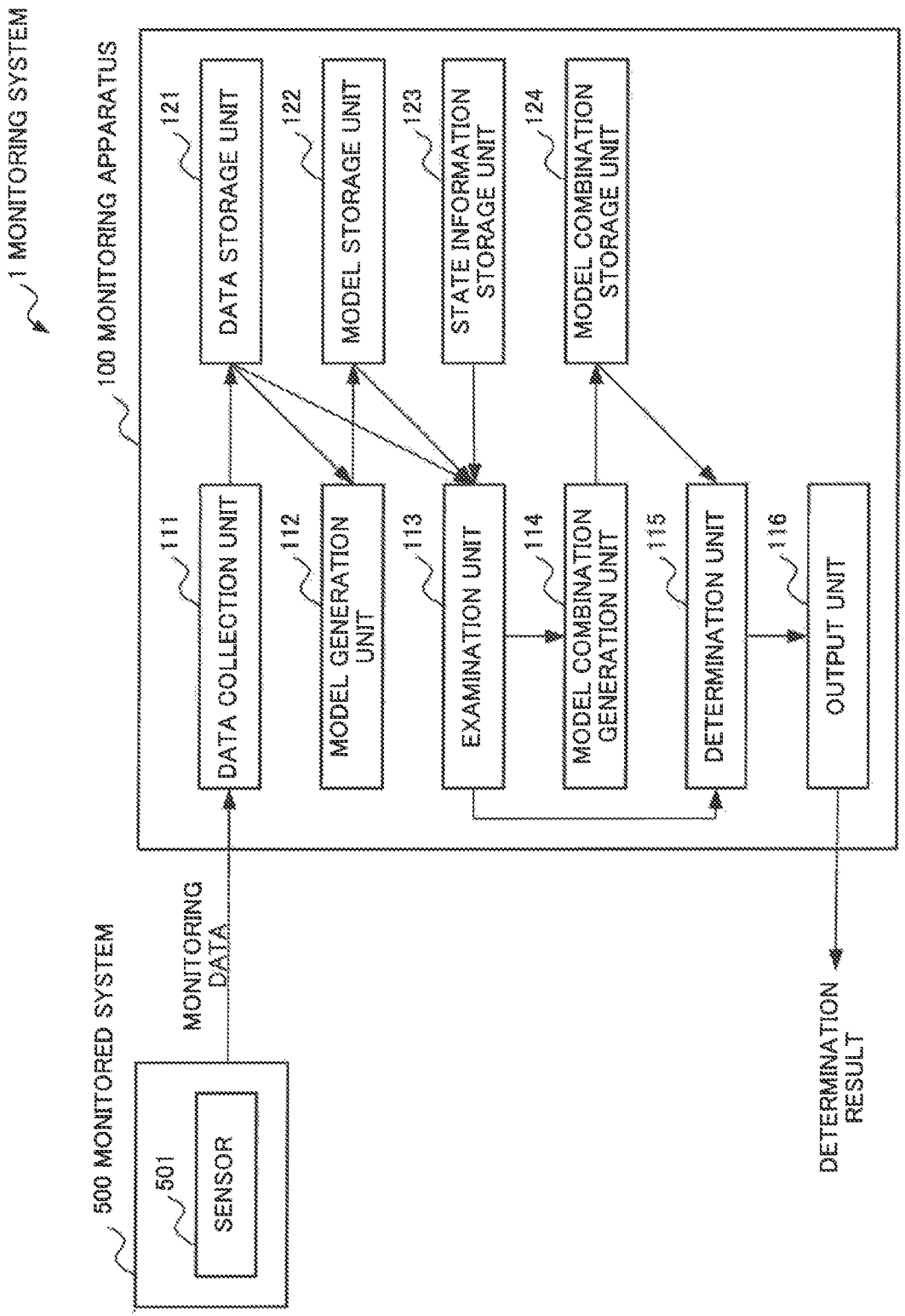
FIG. 2 is a block diagram illustrating a configuration of a monitoring system 1 in the example embodiment of the present invention.

First, a configuration of the example embodiment of the present invention will be described. FIG. 2 is a block diagram illustrating a configuration of a monitoring system 1 in the example embodiment of the present invention.

Referring to FIG. 2, the monitoring system 1 includes a monitoring apparatus 100 and a monitored system 500 (or also simply described as a system). The monitoring apparatus 100 and the monitored system 500 are connected by a network or the like. The monitoring system 1 is one example embodiment of an information processing system of the present invention. In addition, the monitoring apparatus 100 is one example embodiment of an information processing apparatus of the present invention.

The monitoring system 1 is, for example, a plant system. In this case, the monitored system 500 is, for example, a plant that performs predetermined processing, such as a chemical plant, a petroleum refining plant, or an iron-making plant.

The monitored system 500 includes sensors 501. The sensors 501 respectively measures values of a plurality of metrics (indexes) to be monitored in the monitored system 500 at regular intervals. Here, as the metrics, for example, temperature, pressure, vibration, electric power, voltage, current, and the like of each part of the monitored system 500 are used. In addition, as the metrics, weight, quantity, ratio, and the like of a raw material or a product in each part of the monitored system 500 may be used. In addition, as the metrics for a machine, parameters specified by ISO (International Organization for Standardization) 13380 and the like may be used. Hereinafter, the plurality of metrics to be monitored will be also referred to as monitoring data.

The monitoring apparatus 100 determines a state of the monitored system 500. The monitoring apparatus 100 includes a data collection unit 111, a model generation unit 112, an examination unit 113, a model combination generation unit 114, a determination unit 115, and an output unit 116. The monitoring apparatus 100 further includes a data storage unit 121, a model storage unit 122, a state information storage unit 123, and a model combination storage unit 124.

The data collection unit 111 collects a time series of values of monitoring data from the monitored system 500.

The data storage unit 121 stores the collected time series of the monitoring data.

The model generation unit 112 generates a model representing a statistical relation (hereinafter, also simply described as a relation) among metrics based on the time series during a modelling period of the monitoring data.

In the example embodiment of the present invention, as the model representing the statistical relation among the metrics, a correlation model 132 for each pair of the metrics is used.

The model generation unit 112 generates the correlation model 132 as described in PTL 2, for example, for each pair of the metrics. The correlation model 132 includes a correlation function (or a conversion function) representing a correlation of a pair of the metrics. The correlation function is a function that predicts, using values of one metric (input metric) of the pair of the metrics at time t and times before time t and values of the other metric (output metric) at times before time t, a value of the output metric at time t.

The model storage unit 122 stores the correlation models 132 generated by the model generation unit 112.

The state information storage unit 123 stores state information 133 representing a state to be detected (targeted state).

FIG. 7 is a diagram illustrating the state information 133 in the example embodiment of the present invention. In the example of FIG. 7, the state information 133 includes a targeted state ("state" column), a state period that is a period during which the system is in the targeted state ("period" column), and a comment such as an explanation of the targeted state ("comment" column). The targeted state, the state period, and the comment are set in advance by a user or the like, for example.

The examination unit 113 extracts conformable correlation models 132 for each pair of the metrics, based on monitoring data of each state period or a determination target period, stored in the data storage unit 121.

The model combination generation unit 114 generates model combination information 134 in which each of the targeted states and a combination of correlation models 132 extracted for respective pairs of the metrics are associated.

The model combination storage unit 124 stores the model combination information 134 generated by the model combination generation unit 114.

The determination unit 115 determines a state of the monitored system 500, by comparing a combination of correlation models 132 extracted for the respective pairs of the metrics for a determination target period and combinations of correlation models 132 represented by the model combination information 134.

The output unit 116 outputs (displays) a determination result screen 136 indicating a determination result of the state of the monitored system 500 to the user or the like.

It is to be noted that the monitoring apparatus 100 may be a computer that includes a CPU (Central Processing Unit) and a storage medium storing a program, and operates by control based on the program.

Figure 3:
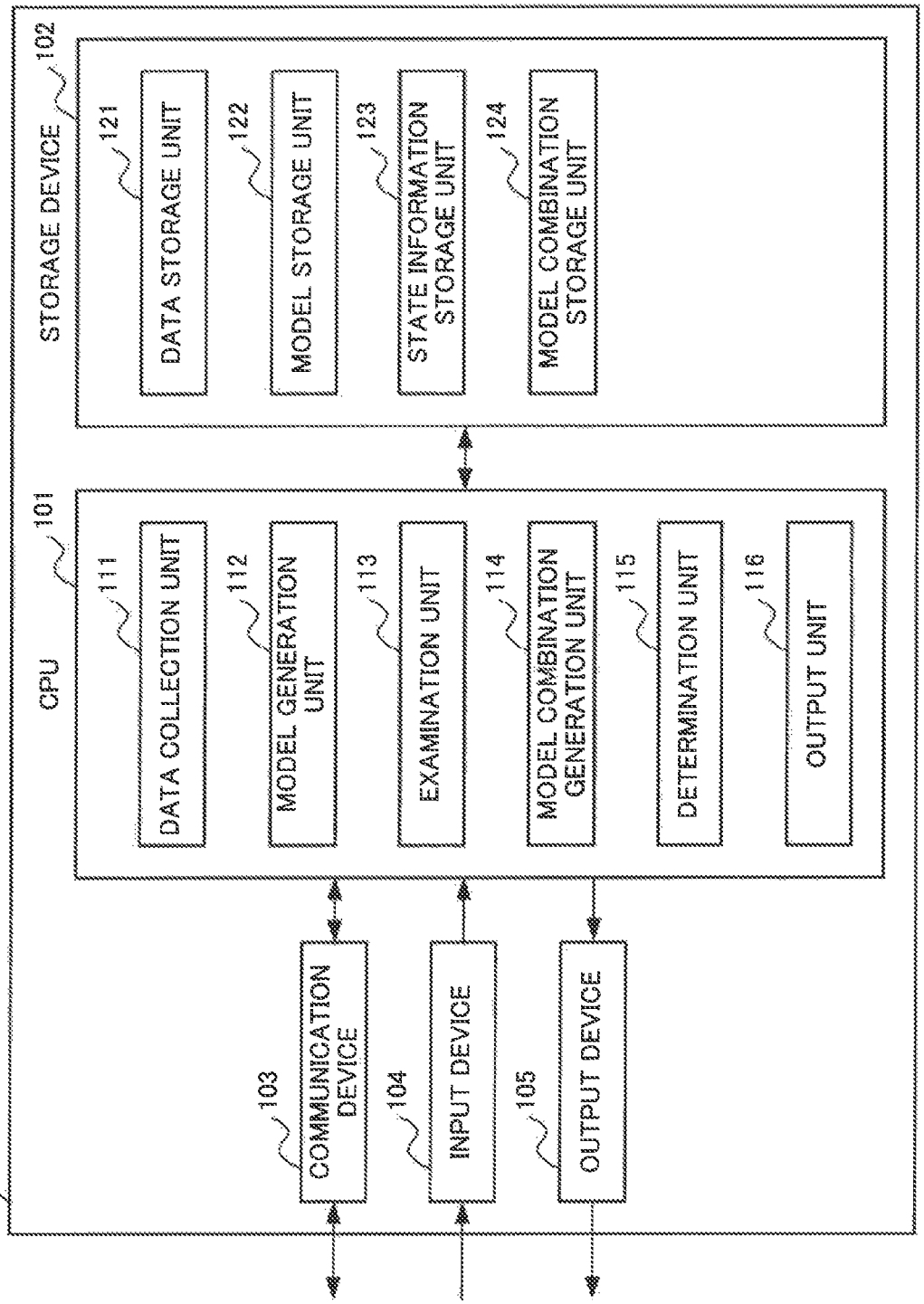
FIG. 3 is a block diagram illustrating a configuration of the monitoring apparatus 100 implemented by a computer in the example embodiment of the present invention.

FIG. 3 is a block diagram illustrating a configuration of the monitoring apparatus 100 implemented by a computer in the example embodiment of the present invention. The monitoring apparatus 100 includes a CPU 101, a storage device 102 (storage medium), such as a hard disk or a memory, a communication device 103 that performs data communication with another apparatus or the like, an input device 104, such as a keyboard, and an output device 105, such as a display.

The CPU 101 executes a computer program for implementing functions of the data collection unit 111, the model generation unit 112, the examination unit 113, the model combination generation unit 114, the determination unit 115, and the output unit 116. The storage device 102 stores information to be stored in the data storage unit 121, the model storage unit 122, the state information storage unit 123, and the model combination storage unit 124. The communication device 103 receives monitoring data from the monitored system 500. The input device 104 receives instructions of model generation, model combination generation, and state determination, which are described below, from the user or the like. The output device 105 outputs (displays) a determination result screen 136 to the user or the like.

In addition, respective components of the monitoring apparatus 100 may be independent logic circuits. In addition, the respective components of the monitoring apparatus 100 may be dispersively arranged in a plurality of physical apparatuses connected via a wired or wireless channel.

Next, the operation of the example embodiment of the present invention will be described in order of a model generation process, a model combination generation process, and a state determination process.

<Model Generation Process>

First, the model generation process of the example embodiment of the present invention will be described.

The model generation process is executed when model generation is instructed specifying a modelling period by a user or the like, for example.

Figure 4:
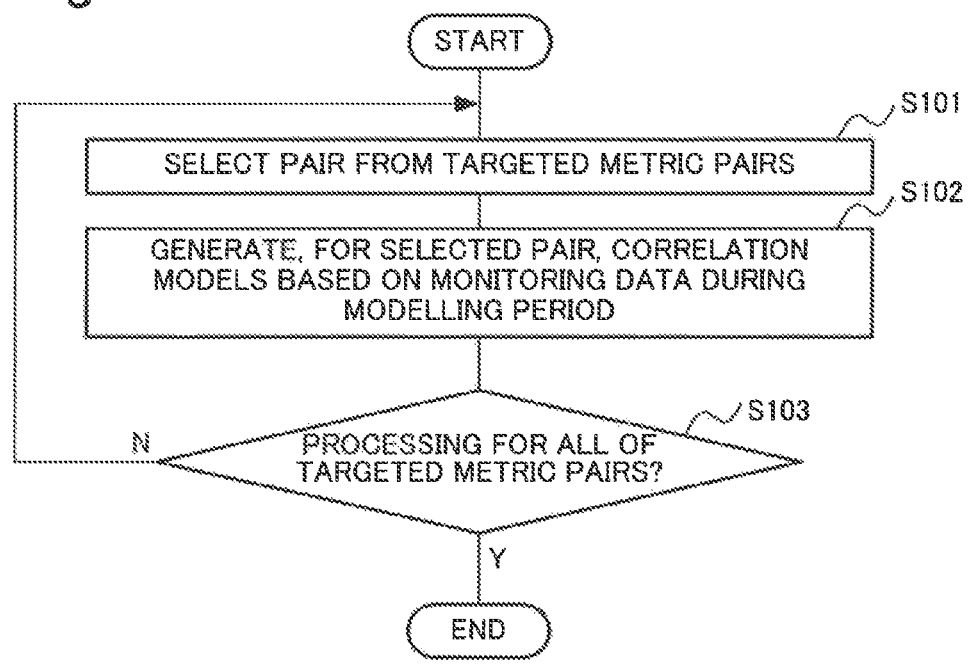
FIG. 4 is a flow chart illustrating a model generation process of the monitoring apparatus 100 in the example embodiment of the present invention.

FIG. 4 is a flow chart illustrating the model generation process of the monitoring apparatus 100 in the example embodiment of the present invention.

Here, it is supposed that, for example, the data collection unit 111 regularly acquires values of monitoring data measured in the monitored system 500, and stores the acquired values of the monitoring data in the data storage unit 121. Moreover, it is supposed that pairs of metrics for which correlation models 132 are to be generated (targeted metric pairs) are selected and set in advance from metrics to be monitored by the user or the like. In this case, as the targeted metric pairs, pairs that can have a relation satisfying a predetermined probability criteria are selected.

The model generation unit 112 selects one pair from the targeted metric pairs (Step S101).

The model generation unit 112 generates, for the selected pair, one or more correlation models 132 respectively representing different relations existing during the modelling period, based on the monitoring data during the modelling period (Step S102). The model generation unit 112 stores the generated correlation models 132 in the model storage unit 122.

Here, the model generation unit 112 divides the modelling period into a plurality of unit periods, and generates a correlation model 132 for each of the unit periods, based on the monitoring data of the corresponding unit period, in the same manner as the technique described in PTL 1, for example. Then, the model generation unit 112 may extract one or more correlation models 132 from the correlation models 132 generated for the respective unit periods, based on a degree of conformance for the entire modelling period, for example. Alternatively, the model generation unit 112 may extract correlation models 132 applicable to one or more unit periods, in the same manner as the technique described in PTL 3, based on the correlation models 132 generated for the respective unit periods, for example.

The model generation unit 112 repeats processing from Step S101 for all of the targeted metric pairs (Step S103).

FIG. 8 is a diagram illustrating an example of correlation models 132 in the example embodiment of the present invention. In FIG. 8, Mxy(n) is an n-th correlation model 132 for a pair of an input metric x and an output metric y. Fxy(n) is a correlation function of the correlation model Mxy(n).

For example, the model generation unit 112 generates two correlation models 132, a correlation model Mab(1) and a correlation model Mab(2) for a pair of input and output metrics "A, B" based on the monitoring data during the modelling period, as illustrated in FIG. 8. In the same manner, the model generation unit 112 generates correlation models 132 for input and output metrics "A, C", "B, C", "D, E", and "D, F", as illustrated in FIG. 8.

<Model Combination Generation Process>

Next, the model combination generation process of the example embodiment of the present invention will be described.

The model combination generation process is executed when model combination generation is instructed after state information 133 is set by the user or the like, for example.

Figure 21:
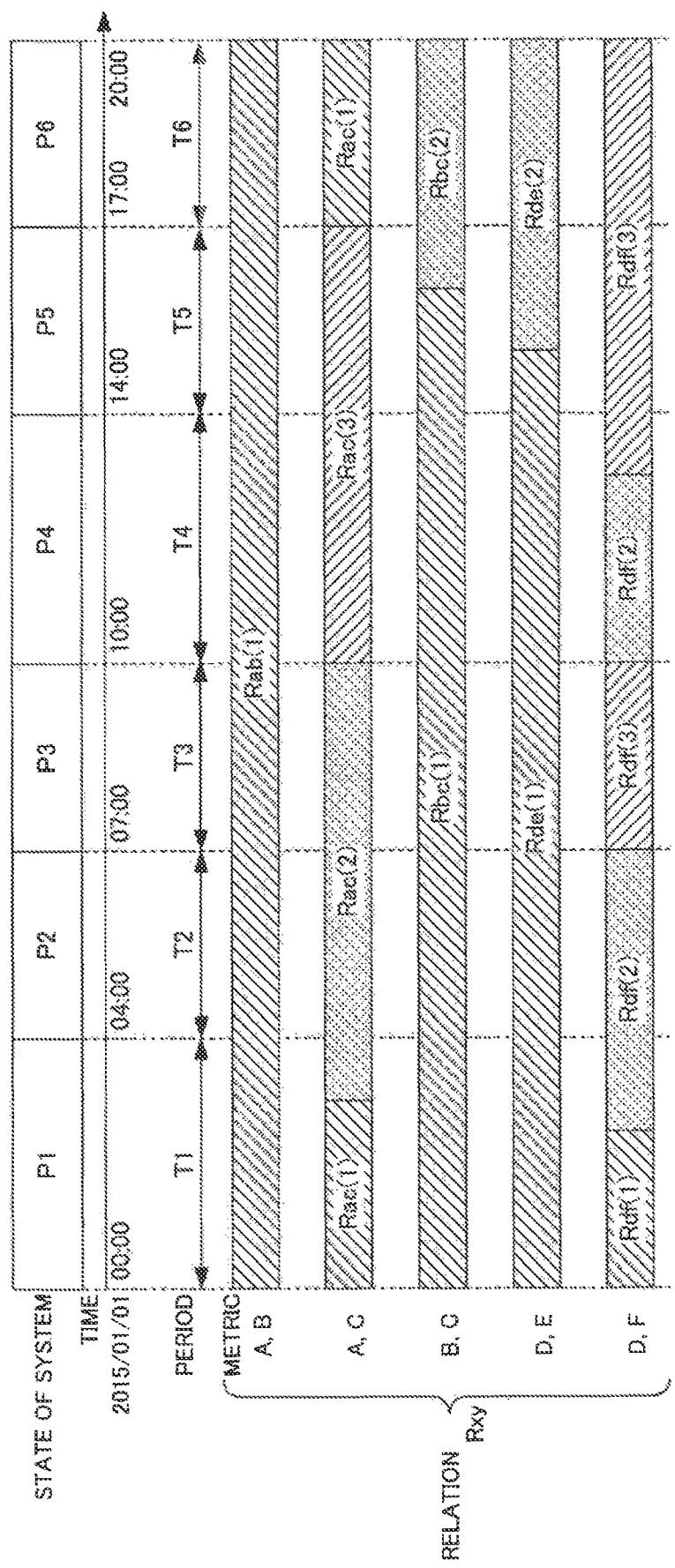
FIG. 21 is a diagram illustrating another example of a relation among metrics for each state of a system.

Here, it is supposed that model combination information 134 is generated for the case that targeted states are normal states P1, P2, . . . of the system, as illustrated in FIG. 21. In addition, it is supposed that, for the states P1, P2, ..., state information 133 as in FIG. 7 is set in the state information storage unit 123.

Figure 5:
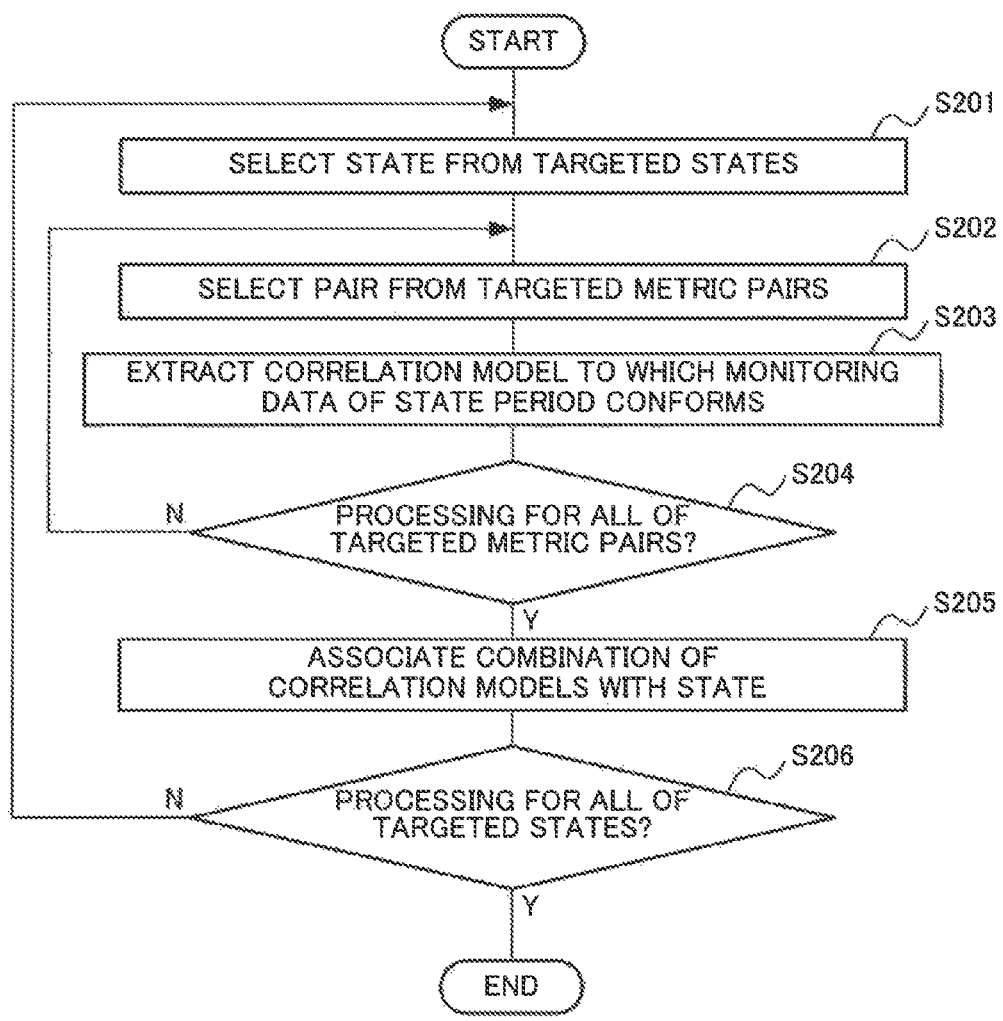
FIG. 5 is a flow chart illustrating a model combination generation process of the monitoring apparatus 100 in the example embodiment of the present invention.

FIG. 5 is a flow chart illustrating the model combination generation process of the monitoring apparatus 100 in the example embodiment of the present invention.

The examination unit 113 selects one state from the targeted states of the system (Step S201).

The examination unit 113 selects one pair from the targeted metric pairs (Step S202).

The examination unit 113 extracts a correlation model 132 to which monitoring data of a state period associated with the selected state conforms, from one or more correlation models 132 generated for the selected pair (Step S203). Here, the examination unit 113 extracts, as the correlation model 132 to which the monitoring data conforms, a correlation model 132 including a correlation function whose prediction error in the entire state period with respect to values of the pairs of metrics of the period is minimum (a degree of conformance is maximum), for example.

The examination unit 113 repeats processing from Step S202 for all of the targeted metric pairs (Step S204).

The model combination generation unit 114 sets, in the model combination information 134, a combination of the correlation models 132 extracted for the respect pairs, in association with the selected state (Step S205).

Figure 9:
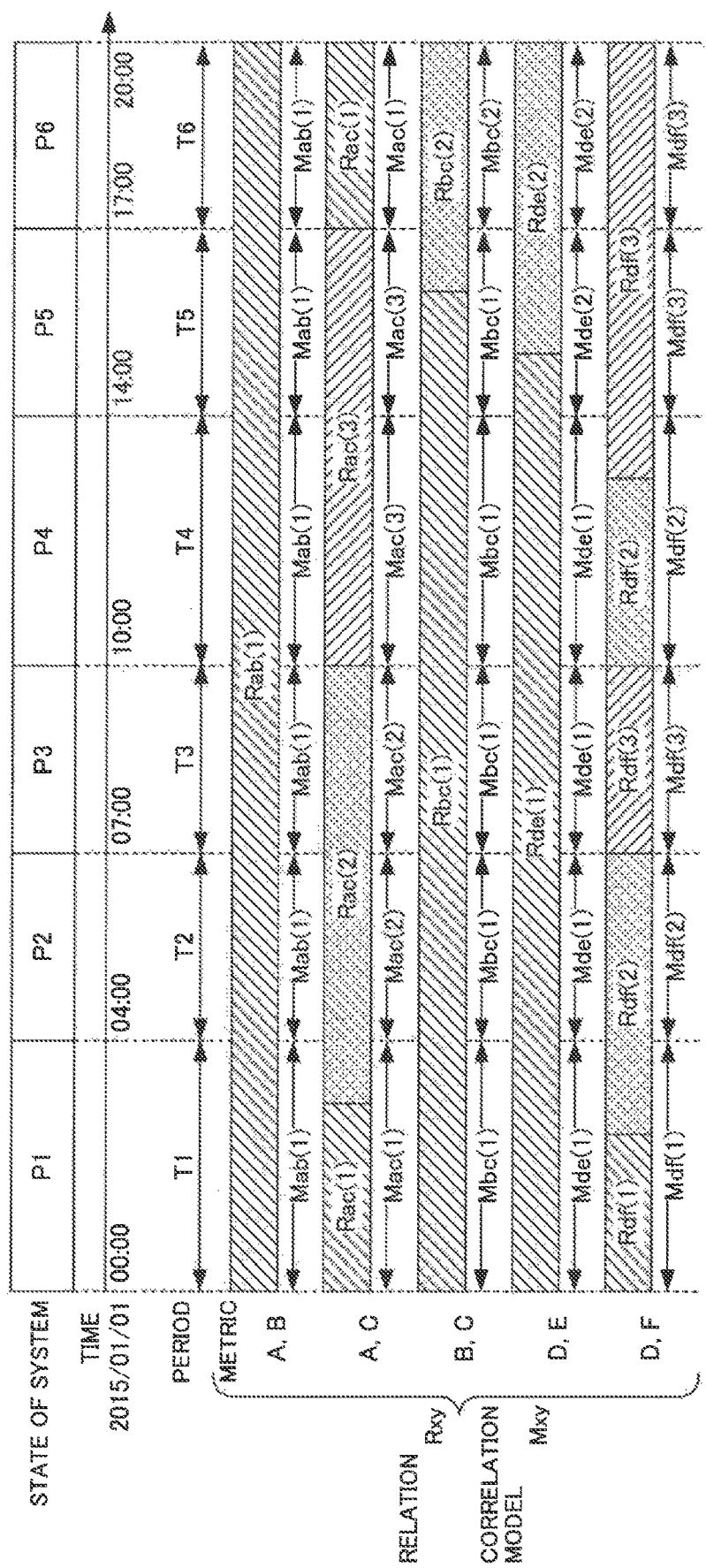
FIG. 9 is a diagram illustrating an example of correlation models 132 extracted for each state of the system in the example embodiment of the present invention.

FIG. 9 is a diagram illustrating an example of correlation models 132 extracted for each state of the system in the example embodiment of the present invention. FIG. 10 is a diagram illustrating an example of model combination information 134 in the example embodiment of the present invention.

For example, the examination unit 113 extracts s, for a pair of input and output metrics "A, B", a correlation model Mab(1) as a correlation model 132 to which monitoring data of a state period T1 for a state P1 conform, as illustrated in FIG. 9. In the same manner, the examination unit 113 extracts, for respective pairs of input and output metrics "A, C", "B, C", "D, E", and "D, F", correlation models Mac(1), Mbc(1), Mde(1), and Mdf(1). Then, the examination unit 113 sets, in the model combination information 134, a combination of the extracted correlation models 132, in association with the state P1, as illustrated in FIG. 10.

Hereinafter, processing from Step S201 is repeated for all of the targeted states (Step S206).

For example, for states P2, P3, ..., P6 of the system, conformable correlation models 132 are extracted for each pair of the metrics in the same manner. By this, the model combination information 134 as in FIG. 10 is generated.

<State Determination Process>

Next, the state determination process of the example embodiment of the present invention will be described.

The state determination process is executed when state determination is instructed together with a determination target period by the user or the like, for example.

Figure 6:
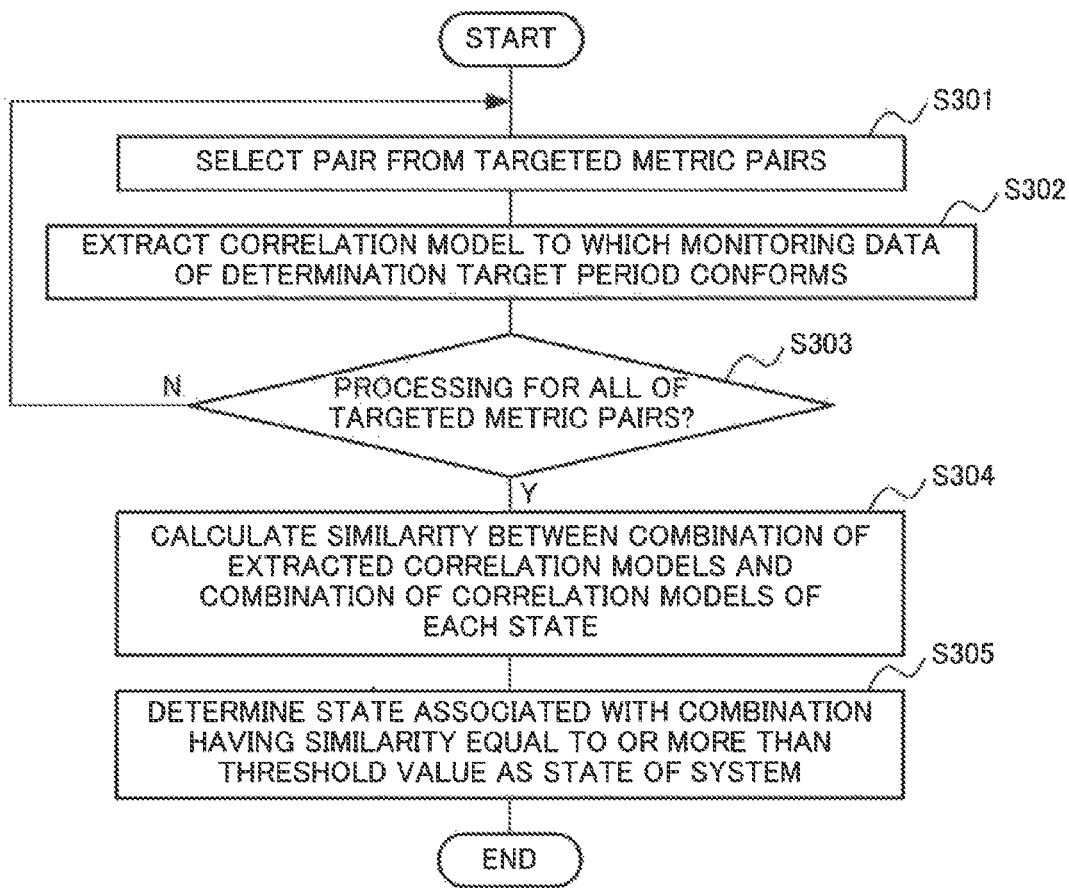
FIG. 6 is a flow chart illustrating a state determination process of the monitoring apparatus 100 in the example embodiment of the present invention.

FIG. 6 is a flow chart illustrating state determination process of the monitoring apparatus 100 in the example embodiment of the present invention.

The examination unit 113 selects one pair from the targeted metric pairs (Step S301).

The examination unit 113 extracts, for the selected pair of metrics, a correlation model 132 to which monitoring data of the determination target period conforms, from one or more correlation models 132 which have been generated (Step S302). Here, the examination unit 113 extracts a correlation model 132 whose prediction error, in the entire determination target period, with respect to values of the metrics is minimum (a degree of conformance is maximum), for example.

The examination unit 113 repeats processing from Step S301 for all of the pairs of metrics for which correlation models 132 have been generated (Step S303).

FIG. 11 is a diagram illustrating an example of a combination of correlation models 132 extracted for a determination target period in the example embodiment of the present invention.

For example, the examination unit 113 extracts a combination of correlation models 132 as in FIG. 11 for a determination target period "2015/02/01 10:00-11:00".

The determination unit 115 calculates a similarity by comparing the combination of the correlation models 132 extracted for the determination target period and a combination of the correlation models 132 of each state set in the model combination information 134 (Step S304). Here, the determination unit 115 calculates a similarity S by Expression 1, for example.

$$S = \frac{1}{N}\sum_{i=1}^{N} s_i \quad \text{[Expression 1]}$$

$$s_i = \begin{cases} 0 & \text{(models for pair } i \text{ are different)} \\ 1 & \text{(models for pair } i \text{ are the same)} \end{cases}$$

Here, N is the number of the targeted metric pairs.

Figure 12:
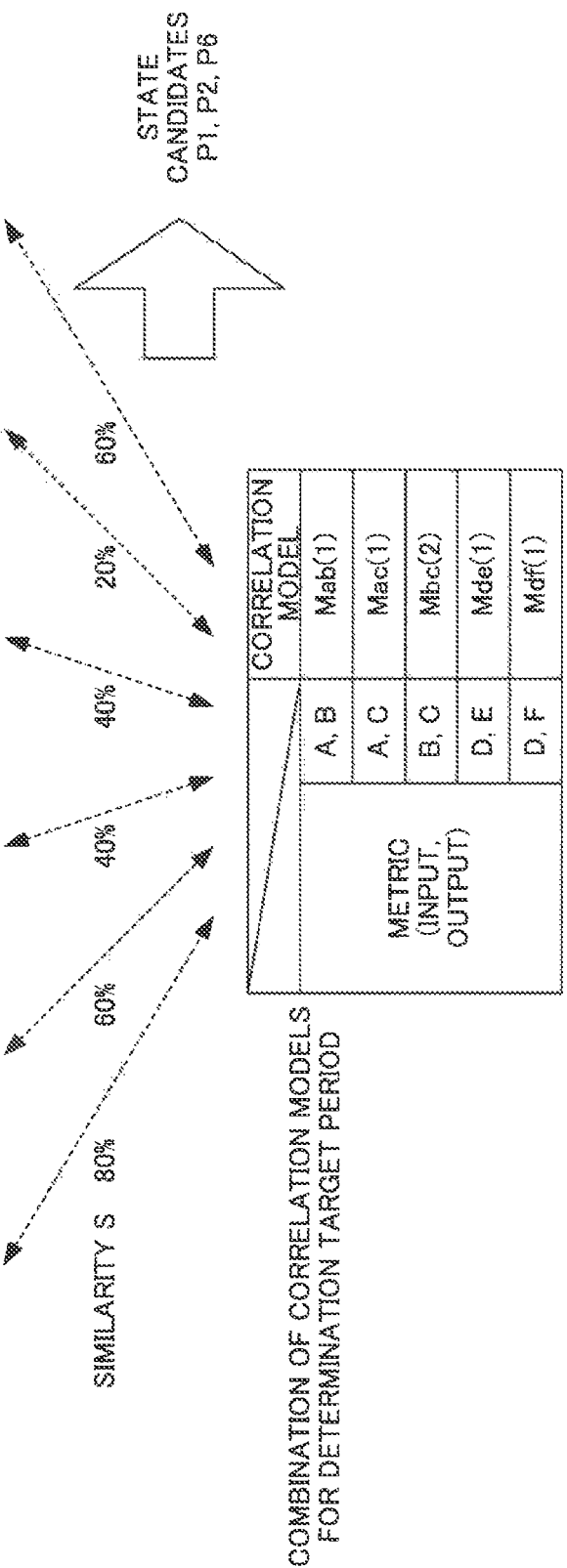
FIG. 12 is a diagram illustrating an example of a comparison result of combinations of correlation models 132 in the example embodiment of the present invention.

FIG. 12 is a diagram illustrating an example of a comparison result of combinations of correlation models 132 in the example embodiment of the present invention.

For example, the determination unit 115 calculates similarities as in FIG. 12 using Expression 1, based on the combination of the correlation models 132 of FIG. 11 and the combinations of the correlation models 132 of the respective states set in the model combination information 134 of FIG. 10.

The determination unit 115 extracts a combination having similarity equal to or more than a predetermined threshold value among the combinations of the correlation models 132 set in the model combination information 134. Then, the determination unit 115 determines a state associated with each extracted combination as a state of the system in the determination target period (state candidate), and outputs the determined state of the system through the output unit 116 (Step S305).

For example, when the threshold value of the similarity is 60%, the determination unit 115 determines the states P1, P2, and P6 having the similarities equal to or more than 60% in FIG. 12 as the states of the system (state candidates).

FIG. 13 is a diagram illustrating an example of a determination result screen 136 in the example embodiment of the present invention. In the example of FIG. 13, in the determination result screen 136, each of state candidates that are the determination result ("state" column) and a similarity of the corresponding candidate ("similarity" column) are displayed in descending order of the similarity. Furthermore, a state period and a comment ("comment" column) for the corresponding candidate ("period" column), which are set in the state information 133, are also displayed.

For example, the output unit 116 displays the determination result screen 136 as in FIG. 13.

It is to be noted that, the determination unit 115 may determine a state associated with a combination having the highest similarity among similarities equal to or more than the threshold value, or a state associated with a combination having the highest similarity, as a state of the system, instead of determining a state associated with a combination having a similarity equal to or more than the threshold value, as the state of the system (state candidate).

For example, the determination unit 115 determines the state P1 having the similarity being equal to or more than 60% and the highest, as the state of the system, in FIG. 12.

Figure 14:
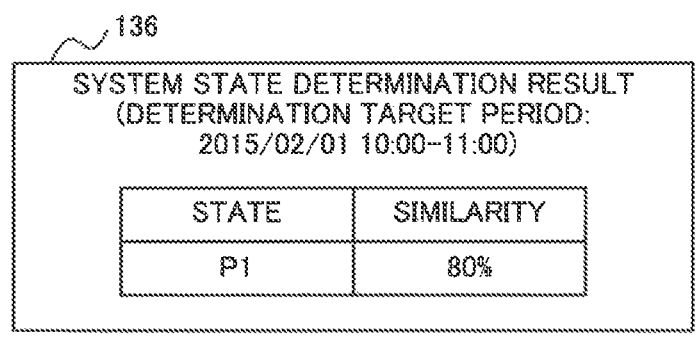
FIG. 14 is a diagram illustrating another example of the determination result screen 136 in the example embodiment of the present invention.

FIG. 14 is a diagram illustrating another example of the determination result screen 136 in the example embodiment of the present invention. In the example of FIG. 14, in the determination result screen 136, a state that is the determination result ("state" column) and a similarity of the candidate ("similarity" column) are displayed.

For example, the output unit 116 displays the determination result screen 136 as in FIG. 14.

Alternatively, the state determination process may be executed repeatedly for each determination target period having a predetermined length, for example.

When the state determination process is executed repeatedly, the determination unit 115 may perform the following processing in order to avoid an influence of temporary noise of monitoring data, or the like, on the determination result.

For example, when a difference between the largest similarity and the second largest similarity calculated for the determination target period is equal to or more than a predetermined threshold value, the determination unit 115 may determine a state associated with a combination having the largest similarities as a new state of the system. Otherwise, the determination unit 115 determines the state of the system determined for the previous determination target period as the state of the system (maintains the previous determination result).

Figure 15:
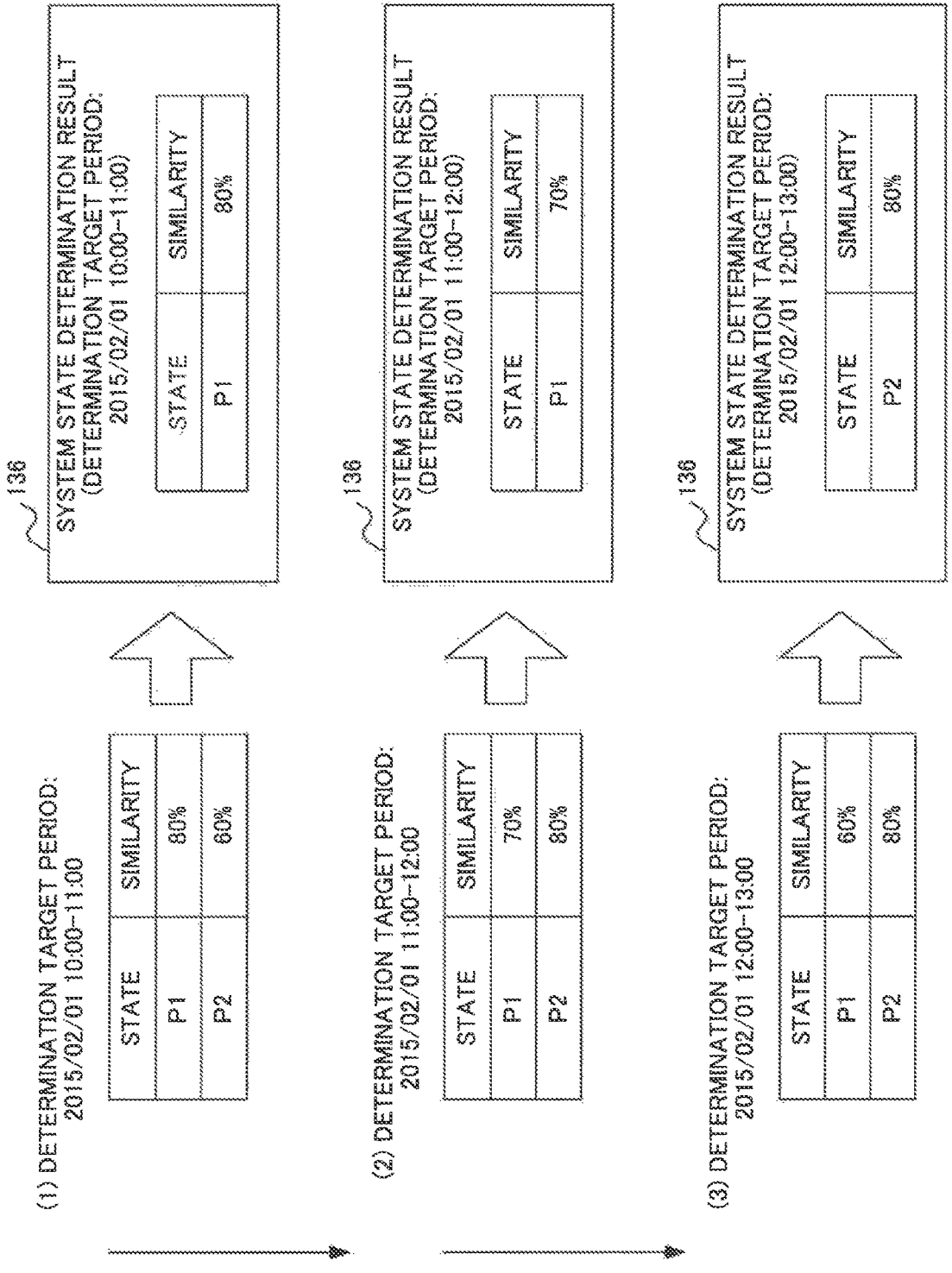
FIG. 15 is a diagram illustrating an example of a repetition of the state determination process in the example embodiment of the present invention.

FIG. 15 is a diagram illustrating an example of a repetition of the state determination process in the example embodiment of the present invention.

Here, it is supposed that the threshold value for the difference between the similarities is 20 points.

In a determination target period "2015/02/01 11:00-12:00", the largest similarity is 80% for the state P2, and the second largest similarity is 70% for the state P1. Since the difference between the similarities is less than the threshold value, the determination unit 115 maintains the previous determination result P1 as illustrated in FIG. 15.

Furthermore, in a determination target period "2015/02/01 12:00-13:00", the largest similarity is 80% for the state P2, and the second largest similarity is 60% for the state P1. Since the difference between the similarities is equal to or more than the threshold value, the determination unit 115 determines the state of the system of the determination target period as a new state P2, as illustrated in FIG. 15.

Alternatively, the determination unit 115 may determine, when a similarity with a certain combination is maximum, continuously predetermined times, a state associated with the combination as a new state of the system, for example. Otherwise, the determination unit 115 determines the state of the system determined for the previous determination target period as the state of the system (maintains the previous determination).

In the above-described description, when calculating the similarity, a correlation model 132 whose prediction error is minimum in each state period and a correlation model 132 whose prediction error is minimum in a determination target period is compared. However, without limiting thereto, when calculating the similarity, a correlation model 132 whose occupation rate (a rate of a period during which a prediction error is minimum) in each state period is the largest and a correlation model 132 whose occupation rate in the determination target period is the largest may be compared.

In this case, in the model combination generation process, the examination unit 113 calculates an occupation rate in each state period for each of one or more correlation models 132 generated for each pair of metrics. Then, the examination unit 113 extracts a correlation model 132 having the largest occupation rate for each pair of metrics.

Figure 16:
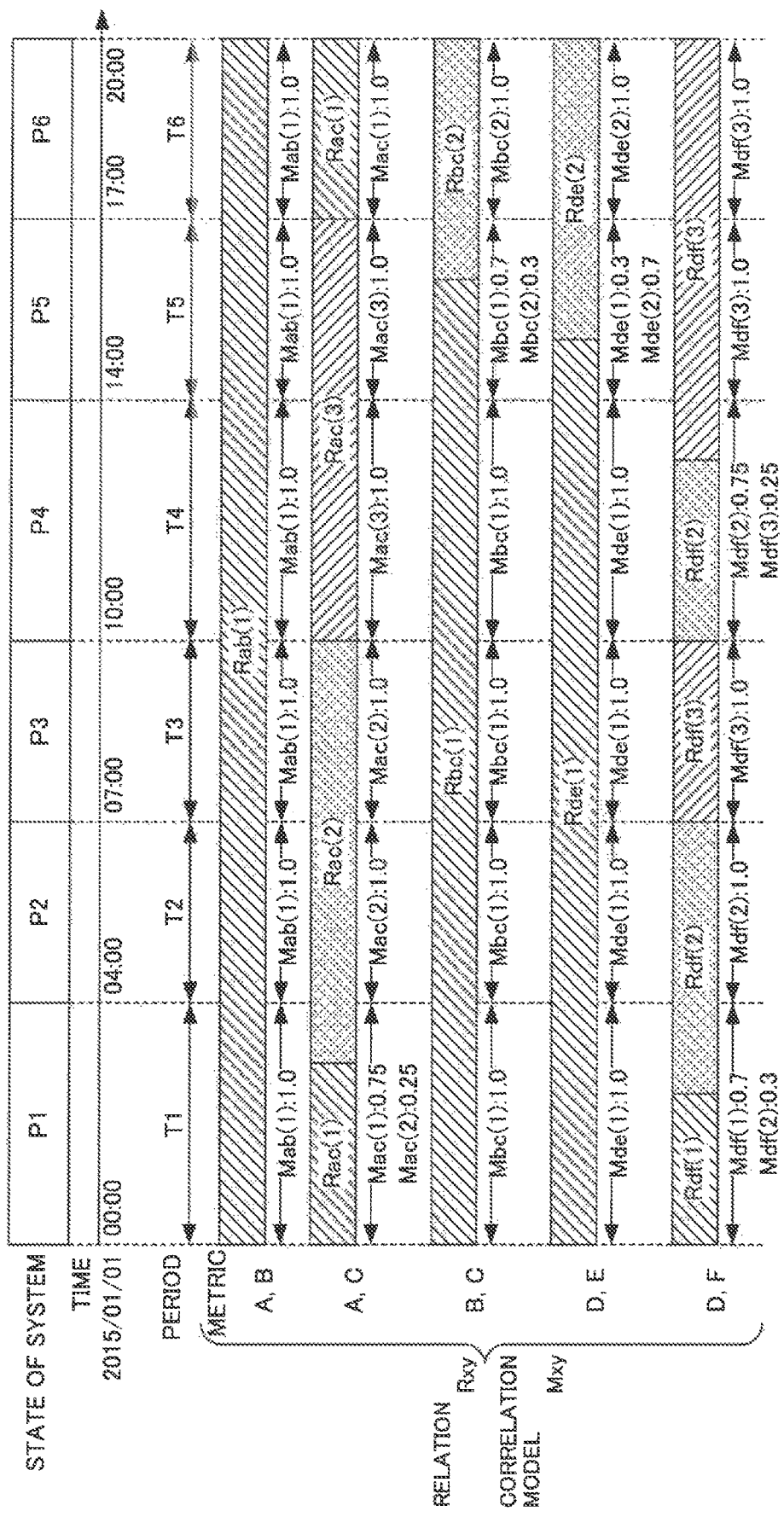
FIG. 16 is a diagram illustrating another example of correlation models 132 extracted for each state of the system in the example embodiment of the present invention.

FIG. 16 is a diagram illustrating another example of correlation models 132 extracted for each state of the system in the example embodiment of the present invention.

For example, as illustrated in FIG. 16, the examination unit 113 calculates an occupation rate 1.0 of a correlation model Mab(1) in the state period T1 associated with the state P1 for the pair of the metrics "A, B". The examination unit 113 extracts the correlation model Mab(1) for the pair. The examination unit 113 calculates an occupation rate 0.75 of a correlation model Mac(1) and an occupation rate 0.25 of a correlation model Mac(2) in the state period T1 for the pair of the metrics "A, C". The examination unit 113 extracts the correlation model Mac(1) having a larger occupation rate for the pair. The examination unit 113 calculates an occupation rate of each correlation model 132 in the state period T1 for each of other pairs of the metrics, and extracts a correlation model 132 having a larger occupation rate. Furthermore, the examination unit 113 extracts correlation models 132 based on occupation rates for other states. Then, the model combination generation unit 114 generates model combination information 134 as in FIG. 10.

In the same manner, in the state determination process, the examination unit 113 extracts a correlation model 132 having the largest occupation rate in a determination target period for each pair of metrics.

For example, the examination unit 113 extracts a combination of correlation models 132 as in FIG. 11, based on the occupation rates.

Then, the determination unit 115 calculates the similarities as in FIG. 12 using Expression 1, and determines the states P1, P2, and P6 as the states of the system (state candidates), in the same manner as the above-described description.

Alternatively, when calculating a similarity, occupation rates of respective correlation models 132 calculated for each pair of metrics in each state period and occupation rates of the respective correlation models 132 calculated for the corresponding pair of metrics in a determination target period may be compared.

In this case, in the model combination generation process, the model combination generation unit 114 sets an occupation rate of each correlation model 132 calculated for each pair of metrics in the model combination information 134.

FIG. 17 is a diagram illustrating another example of model combination information 134 in the example embodiment of the present invention.

For example, in the model combination generation process, the model combination generation unit 114 generates model combination information 134 as in FIG. 17, based on the occupation rates of FIG. 16 calculated by the examination unit 113.

In the same manner, in the state determination process, the examination unit 113 calculates an occupation rate of each correlation model 132 in a determination target period for each pair of the metrics.

FIG. 18 is a diagram illustrating another example of a combination of correlation models 132 extracted during the determination target period in the example embodiment of the present invention.

For example, the examination unit 113 calculates an occupation rate of each correlation model 132 as in FIG. 18 for each pair of the metrics.

The determination unit 115 calculates the similarity by comparing occupation rates of respective correlation models 132 calculated for each pair of metrics and occupation rates of the respective correlation models 132 calculated for the corresponding pair of metrics in each state set in the model combination information 134. Here, the determination unit 115 calculates the similarity S by Expression 2, for example.

$$S = \frac{1}{N}\sum_{i=1}^{N} s_i \quad \text{[Expression 2]}$$

$$s_i = \sum_{j=1}^{Mi} r(i,j)\min(g(i,j)/r(i,j), 1)$$

$$= \sum_{j=1}^{Mi} \min(g(i,j), r(i,j))$$

Here, Mi is the number of correlation models 132 generated for a pair i, g(i, j) is an occupation rate of a correlation model j of a pair i in a determination target period, and r(i, j) is an occupation rate of a correlation model j of the pair i in a state period. In addition, min(x, y) is a function for obtaining the smaller of x, y.

Figure 19:
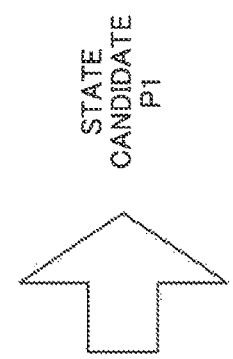
FIG. 19 is a diagram illustrating another example of a comparison result of combinations of correlation models 132 in the example embodiment of the present invention.
Figure 20:
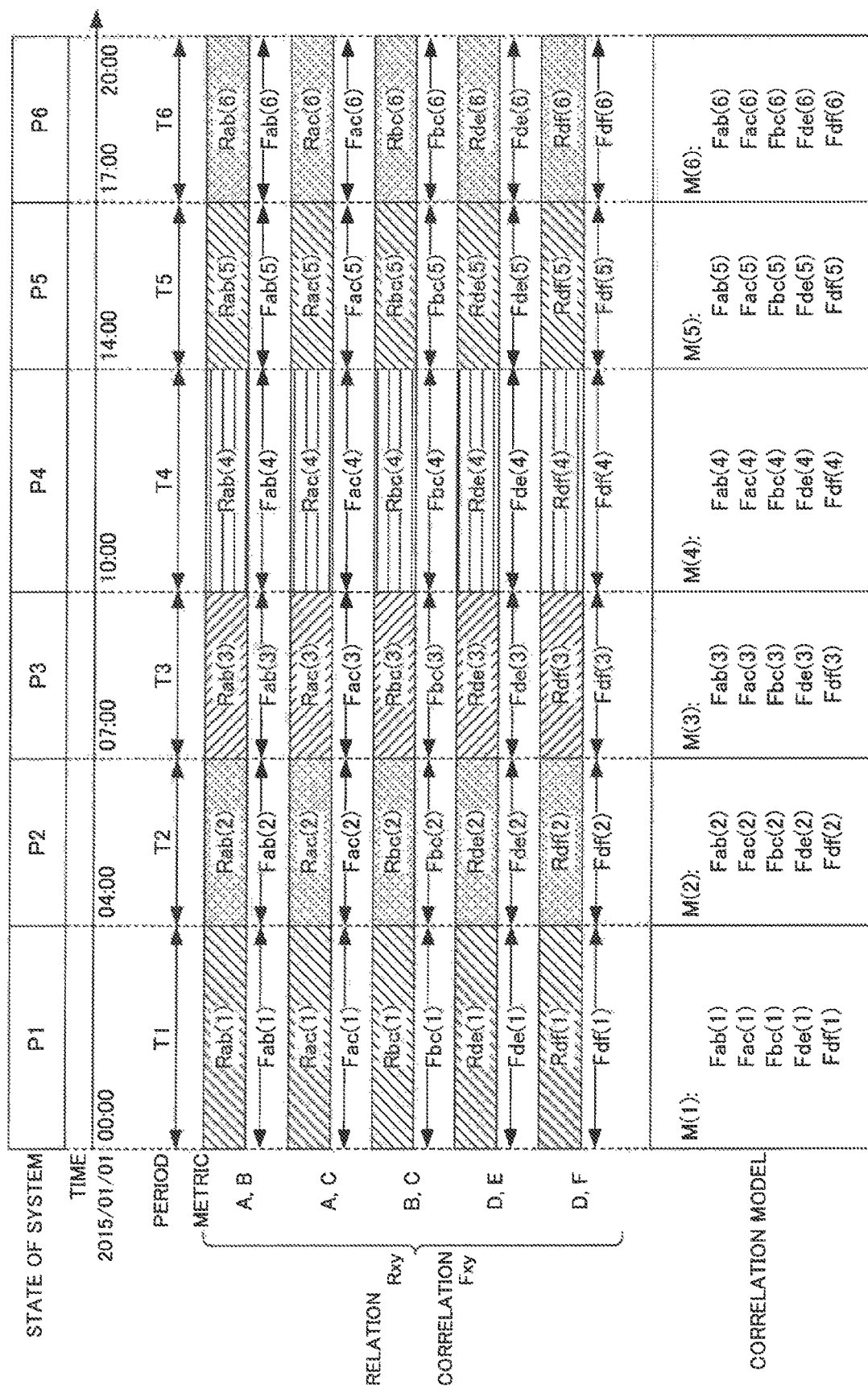
FIG. 20 is a diagram illustrating an example of a relation among metrics for each state of a system.

FIG. 19 is a diagram illustrating another example of a comparison result of combinations of correlation models 132 in the example embodiment of the present invention.

For example, the determination unit 115 calculates similarities as in FIG. 19 using Expression 2, based on the occupation rates of FIG. 18 and the occupation rates set in the model combination information 134 of FIG. 17. Then, the determination unit 115 determines the state P1 as the state of the system (state candidate).

Accordingly, the operation of the example embodiment of the present invention is completed.

It is to be noted that, in the example embodiment of the present invention, a correlation model 132 is used as a model. However, without limiting thereto, another model based on a method well-known in the field of statistical processing may be used as long as a statistical relation among metrics can be represented. For example, a linear or non-linear model, such as an autoregression model or a logistic regression model, or a probability distribution model may be used as a model.

In the example embodiment of the present invention, a model is generated for each of targeted metric pairs selected in advance. However, without limiting thereto, a model may be generated for an exhaustive pair of metrics to be monitored. In addition, a model may be generated for a pair of the metrics, which is selected based on a structure and a configuration of a target to be monitored used as the metrics, or an experience with respect to the target to be monitored (heuristic). Alternatively, a model may be generated for a pair of metrics, which is determined to have a statistical relation as a result of calculation for the monitoring data.

It is indisputable that an expression format of a statistical relation is also appropriately selected depending on a selecting method of a metric set. For example, when using an exhaustive or selective pair of metrics, if it is derived or known that time series of two metrics x, y satisfies y=f(x) statistically, the function f(x) is a statistical relation of the metrics x, y. The function f(x) can take on various formats, such as the above-described linear or non-linear model, or probability distribution model.

In the example embodiment of the present invention, a model is generated for a "pair" of metrics. However, without limiting thereto, a model may be generated for a "set" of metrics including two or more metrics as long as timings of the metrics in the set, at which a statistical relation changes, are similar to each other. In this case, the examination unit 113 extracts conformable models for each set of metrics based on monitoring data of each state period or a determination target period. The model combination generation unit 114 generates model combination information 134 in which respective targeted states and a combination of models extracted for respective sets of metrics are associated. The determination unit 115 determines a state of the monitored system 500 by comparing a combination of models extracted for the respective sets of metrics for a determination target period and combinations of models represented by the model combination information 134.

In the example embodiment of the present invention, a state of the system is outputted as a determination result, however, an abnormality may be notified when state transition different from state transition set in advance is detected.

In the example embodiment of the present invention, a "normal" state of the system is detected by setting a combination of correlation models 132 in a normal state, in the model combination information 134. However, without limiting thereto, an "abnormal" state of the system may be detected by setting a combination of correlation models 132 in an abnormal state, in the model combination information 134.

The monitoring apparatus 100 may not include the model combination generation unit 114 and may determine a state of the system using model combination information 134 generated by another apparatus.

In the example embodiment of the present invention, the case where the monitored system 500 is a plant is described as an example. However, without limiting thereto, the monitored system 500 may be an IT (Information Technology) system including one or more computers as long as a specific state can be defined, and values of metrics for the state can be acquired. In this case, as the metrics, utilization, usage, and the like of a computer resource and a network resource, such as CPU utilization, memory utilization, and disk access frequency, may be used. In addition, the monitored system 500 may be a system of a power plant, communication equipment for carriers, or a movable body, such as a vehicle, a train, a plane, or a ship. In addition, the monitored system 500 may be a structure, such as a building or a bridge.

Figure 1:
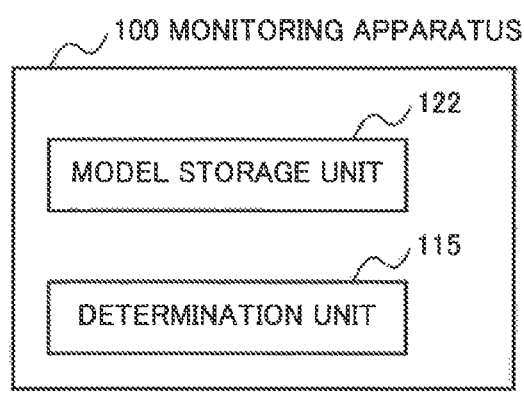
FIG. 1 is a block diagram illustrating a characteristic configuration of an example embodiment of the present invention.

Next, a characteristic configuration of the example embodiment of the present invention will be described. FIG. 1 is a block diagram illustrating a characteristic configuration of the example embodiment of the present invention.

A monitoring apparatus 100 (information processing apparatus) includes a model storage unit 122 and a determination unit 115. The model storage unit 122 stores, for each of a plurality of metric sets in a system, a model representing a relation among metrics included in the corresponding metric set. The determination unit 115 determines and outputs whether the system is in one state, by comparing a combination of models to which the plurality of metric sets conform respectively when the system is in the one state and a combination of models to which the plurality of metric sets conform respectively when the system is in a state to be determined.

Next, an effect of the example embodiment of the present invention will be described.

According to the example embodiment of the present invention, monitoring of a state of a system can be accurately performed even when a timing at which a relation changes is different for each set of the metrics. The reason is that the determination unit 115 determines whether the system is in one state, by comparing a combination of models to which a plurality of metric sets conform respectively when the system is in the one state and a combination of models to which the plurality of metric sets conform respectively when the system is in a state to be determined.

Accordingly, a user or the like can accurately determine whether transition among states of the system is performed as planned.

It is to be noted that there was a problem in that, generally, high skill is required to specify a state of a system in a plant, a facility, equipment, or the like having a complex configuration.

For example, in a simple plant for only generating desired liquid by mixing materials and making the materials react in a water tank, whether or not a reaction phase is completed in standard time can be determined by time until a value of a single temperature sensor reaches a predetermined temperature. However, in a complex plant, such as a petroleum refining plant, it is required to determine that by combining specified or implied indexes, such as a pressure of a pipe, rotational frequency of a motor, quality of a raw material, and an operation mode. Thus, whether a state of the system can be accurately specified depends on plant engineer's skill.

According to the example embodiment of the present invention, a state of the system can be easily specified even in such a complex system. The reason is that the model combination generation unit 114 generates a combination of models to which a plurality of metric sets conform when the system is in one state, and the determination unit 115 determines whether the system is in the one state using the combination of models.

INDUSTRIAL APPLICABILITY

While the present invention has been particularly shown and described with reference to the example embodiments thereof, the present invention is not limited to the embodiments. It will be understood by those of ordinary skill in the art that various changes in form and details may be made therein without departing from the spirit and scope of the present invention as defined by the claims.

The present invention can be widely applied to a system in which a specific state can be defined, and various pieces of data for states can be acquired.

This application is based upon and claims the benefit of priority from Japanese Patent Application No. 2015-048474, filed on Mar. 11, 2015, the disclosure of which is incorporated herein in its entirety by reference.

REFERENCE SIGNS LIST

1 monitoring system
100 monitoring apparatus
101 CPU
102 storage device
103 communication device
104 input device
105 output device
111 data collection unit
112 model generation unit
113 examination unit
114 model combination generation unit
115 determination unit
116 output unit
121 data storage unit
122 model storage unit
123 state information storage unit
124 model combination storage unit
132 correlation model
133 state information
134 model combination information
136 determination result screen
500 monitored system
501 sensor

The invention claimed is:

1. An information processing apparatus comprising:
a memory storing instructions; and
one or more processors configured to execute the instructions to:
  store, for each of a plurality of metric sets in a system, a model representing a relation among metrics included in the corresponding metric set; and
  determine and output whether the system is in one state, by comparing a combination of models to which the plurality of metric sets conform respectively when the system is in the one state and a combination of models to which the plurality of metric sets conform respectively when the system is in a state to be determined,
wherein whether the system is in any of a plurality of states is determined by comparing a combination of models to which the plurality of metric sets conform respectively when the system is in each of the plurality of states and the combination of models to which the plurality of metric sets conform respectively when the system is in the state to be determined,
wherein a state associated with a combination having a similarity with the combination of models when the system is in the state to be determined larger than the similarity of another combination, among combinations of models for the respective plurality of states of the system, is determined as a state of the system, and
wherein determination of the state of the system is repeated, and
wherein when a difference between the largest similarity and the second largest similarity, among similarities of combinations of models for the respective plurality of states of the system with the combination of models when the system is in the state to be determined, is equal to or more than a predetermined threshold value, a state corresponding to a combination having the largest similarity is determined as a state of the system, and otherwise, a state determined at previous time is determined as a state of the system.

2. The information processing apparatus according to claim 1, wherein
the one or more processors configured to further execute the instructions to:
  generate the combination of models to which the plurality of metric sets conform respectively when the system is in the one state.

3. An information processing system comprising:
the information processing apparatus according to claim 1; and
sensors for respectively measuring values of metrics included in each of the plurality of metric sets in the system.

4. A plant system comprising:
the information processing apparatus according to claim 1;
a plant that performs predetermined processing;
sensors that respectively measure values of metrics included in each of the plurality of metric sets in the plant,
wherein
in the information processing apparatus, a state of the plant is determined, using the plant as the system.

5. An information processing method comprising:
storing, for each of a plurality of metric sets in a system, a model representing a relation among metrics included in the corresponding metric set; and
determining and outputting whether the system is in one state, by comparing a combination of models to which the plurality of metric sets conform respectively when the system is in the one state and a combination of models to which the plurality of metric sets conform respectively when the system is in a state to be determined,
wherein whether the system is in any of a plurality of states is determined by comparing a combination of models to which the plurality of metric sets conform respectively when the system is in each of the plurality of states and the combination of models to which the plurality of metric sets conform respectively when the system is in the state to be determined,
wherein a state associated with a combination having a similarity with the combination of models when the system is in the state to be determined larger than the similarity of another combination, among combinations of models for the respective plurality of states of the system, is determined as a state of the system, and
wherein determining the state of the system is repeated, and
wherein when a difference between the largest similarity and the second largest similarity, among similarities of combinations of models for the respective plurality of states of the system with the combination of models when the system is in the state to be determined, is equal to or more than a predetermined threshold value, a state corresponding to a combination having the largest similarity is determined as a state of the system, and otherwise, a state determined at previous time is determined as a state of the system.

6. A non-transitory computer readable storage medium recording thereon a program causing a computer to perform a method comprising:
storing, for each of a plurality of metric sets in a system, a model representing a relation among metrics included in the corresponding metric set; and
determining and outputting whether the system is in one state, by comparing a combination of models to which the plurality of metric sets conform respectively when the system is in the one state and a combination of models to which the plurality of metric sets conform respectively when the system is in a state to be determined,
wherein whether the system is in any of a plurality of states is determined by comparing a combination of models to which the plurality of metric sets conform respectively when the system is in each of the plurality of states and the combination of models to which the plurality of metric sets conform respectively when the system is in the state to be determined,
wherein a state associated with a combination having a similarity with the combination of models when the system is in the state to be determined larger than the similarity of another combination, among combinations of models for the respective plurality of states of the system, is determined as a state of the system, and
wherein determining the state of the system is repeated, and
wherein when a difference between the largest similarity and the second largest similarity, among similarities of combinations of models for the respective plurality of states of the system with the combination of models when the system is in the state to be determined, is equal to or more than a predetermined threshold value, a state corresponding to a combination having the largest similarity is determined as a state of the system, and otherwise, a state determined at previous time is determined as a state of the system.

* * * * *